US009666745B2

(12) United States Patent
Rudmann et al.

(10) Patent No.: US 9,666,745 B2
(45) Date of Patent: May 30, 2017

(54) METHOD FOR MANUFACTURING A COMPOUND FILM

(71) Applicant: FLISOM AG, Duebendorf (CH)

(72) Inventors: Dominik Rudmann, Basel (CH); Marc Kaelin, Zurich (CH); Thomas Studer, Dhahran (SA); Felix Budde, Zurich (CH)

(73) Assignee: FLISOM AG, Duebendorf (CH)

( * ) Notice: Subject to any disclaimer, the term of this patent is extended or adjusted under 35 U.S.C. 154(b) by 0 days.

(21) Appl. No.: 13/952,420

(22) Filed: Jul. 26, 2013

(65) Prior Publication Data
US 2013/0312664 A1 Nov. 28, 2013

Related U.S. Application Data

(63) Continuation of application No. 12/677,665, filed as application No. PCT/EP2007/059600 on Sep. 12, 2007.

(51) Int. Cl.
*C23C 14/52* (2006.01)
*C23C 14/54* (2006.01)
(Continued)

(52) U.S. Cl.
CPC .......... *H01L 31/18* (2013.01); *C23C 14/0623* (2013.01); *C23C 14/545* (2013.01);
(Continued)

(58) Field of Classification Search
CPC ... C23C 14/542; C23C 14/543; C23C 14/544; C23C 14/545; C23C 14/56;
(Continued)

(56) References Cited

U.S. PATENT DOCUMENTS 3,552,352 A * 1/1971 McConnell ............. C04B 35/01
118/720
3,843,881 A * 10/1974 Barton, Jr. ............... G01V 5/12
250/269.1
(Continued)

FOREIGN PATENT DOCUMENTS

DE 10259258 A1 7/2004
EP 0206585 A2 12/1986
(Continued)

OTHER PUBLICATIONS

Office Action dated Aug. 28, 2012, U.S. Appl. No. 12/677,665.
(Continued)

*Primary Examiner* — Gordon R Baldwin
*Assistant Examiner* — Aiden Lee
(74) *Attorney, Agent, or Firm* — Patterson & Sheridan, LLP

(57) ABSTRACT

A method for manufacturing a compound film comprising a substrate and at least one additional layer is disclosed. The method comprising the steps of depositing at least two chemical elements on the substrate and/or on the at least one additional layer using depositions sources, maintaining depositing of the at least two chemical elements while the substrate and the deposition sources are being moved relative to each other, measuring the compound film properties, particularly being compound film thickness, compound-film overall composition, and compound-film composition in one or several positions of the compound film, comparing the predefined values for the compound film properties to the measured compound film properties, and adjusting the deposition of the at least two chemical elements in case the measured compound film properties do not match the predefined compound film properties.

22 Claims, 6 Drawing Sheets

(51) Int. Cl.
*H01L 31/18* (2006.01)
*C23C 14/06* (2006.01)
*H01L 31/032* (2006.01)

(52) U.S. Cl.
CPC ........ *C23C 14/548* (2013.01); *H01L 31/0322* (2013.01); *H01L 31/1844* (2013.01); *Y02E 10/541* (2013.01); *Y02E 10/544* (2013.01); *Y02P 70/521* (2015.11)

(58) Field of Classification Search
CPC ... C23C 14/546–14/547; H01L 31/032; H01L 31/04
See application file for complete search history.

(56) References Cited

U.S. PATENT DOCUMENTS

| | | | |
|---|---|---|---|
| 3,978,510 A | | 8/1976 | Kasper et al. |
| 3,995,162 A | * | 11/1976 | Peterson ...................... 250/453 |
| 4,162,528 A | | 7/1979 | Maldonado et al. |
| 4,352,043 A | * | 9/1982 | Rigden ............................. 315/1 |
| 4,465,575 A | | 8/1984 | Love et al. |
| 4,523,051 A | | 6/1985 | Mickelsen et al. |
| 4,611,091 A | | 9/1986 | Choudary et al. |
| 4,684,761 A | | 8/1987 | Devaney |
| 4,705,698 A | | 11/1987 | Van Dine |
| 4,726,850 A | | 2/1988 | Wenham et al. |
| 4,892,592 A | | 1/1990 | Dickson et al. |
| 5,014,288 A | * | 5/1991 | Chase et al. ..................... 378/53 |
| 5,078,803 A | | 1/1992 | Pier et al. |
| 5,078,804 A | | 1/1992 | Chen et al. |
| 5,141,564 A | | 8/1992 | Chen et al. |
| 5,162,131 A | * | 11/1992 | Rantanen et al. ............... 427/10 |
| 5,356,839 A | | 10/1994 | Tuttle et al. |
| 5,409,549 A | | 4/1995 | Mori |
| 5,439,575 A | | 8/1995 | Thornton et al. |
| 5,441,897 A | | 8/1995 | Noufi et al. |
| 5,474,622 A | | 12/1995 | Negami et al. |
| 5,483,568 A | | 1/1996 | Yano et al. |
| 5,532,102 A | | 7/1996 | Soden et al. |
| 5,626,688 A | | 5/1997 | Probst et al. |
| 5,627,871 A | * | 5/1997 | Wang ........................ G03F 9/70 378/102 |
| 5,803,976 A | | 9/1998 | Baxter et al. |
| 5,930,586 A | | 7/1999 | Jain et al. |
| 5,980,975 A | * | 11/1999 | Nomura ................. C23C 14/547 118/691 |
| 6,040,521 A | | 3/2000 | Kushiya et al. |
| 6,121,624 A | | 9/2000 | Stevie et al. |
| 6,184,058 B1 | | 2/2001 | Umemoto et al. |
| 6,202,591 B1 | | 3/2001 | Witzman et al. |
| 6,258,620 B1 | | 7/2001 | Morel et al. |
| 6,300,556 B1 | | 10/2001 | Yamagishi et al. |
| 6,300,593 B1 | | 10/2001 | Powell |
| 6,310,281 B1 | | 10/2001 | Wendt et al. |
| 6,372,538 B1 | | 4/2002 | Wendt et al. |
| 6,402,905 B1 | * | 6/2002 | Baldwin et al. ......... 204/192.13 |
| 6,428,848 B1 | | 8/2002 | Hatada et al. |
| 6,559,372 B2 | | 5/2003 | Stanbery |
| 6,562,405 B2 | | 5/2003 | Eser et al. |
| 6,566,628 B2 | | 5/2003 | Vogt et al. |
| 6,578,764 B1 | | 6/2003 | Hiraishi et al. |
| 6,611,576 B1 | | 8/2003 | Besser et al. |
| 6,629,879 B1 | | 10/2003 | Kim et al. |
| 6,631,177 B1 | * | 10/2003 | Haszler ................... G01B 15/02 378/42 |
| 6,830,626 B1 | * | 12/2004 | Smith ........................... 118/726 |
| 6,858,461 B2 | | 2/2005 | Oswald et al. |
| 6,974,976 B2 | | 12/2005 | Hollars |
| 7,194,197 B1 | | 3/2007 | Wendt et al. |
| 7,235,736 B1 | * | 6/2007 | Buller et al. ..................... 136/251 |
| 7,276,724 B2 | | 10/2007 | Sheats et al. |
| 7,442,413 B2 | | 10/2008 | Zwaap et al. |
| 7,512,297 B2 | | 3/2009 | Farah |
| 7,649,141 B2 | | 1/2010 | Schmit et al. |
| 7,666,490 B1 | * | 2/2010 | Iseki et al. ..................... 428/156 |
| 7,829,783 B2 | | 11/2010 | Krajewski et al. |
| 7,964,418 B2 | | 6/2011 | Achutharaman et al. |
| 8,012,788 B1 | | 9/2011 | Frolov et al. |
| 8,048,706 B1 | | 11/2011 | Ghandour et al. |
| 8,107,777 B2 | | 1/2012 | Farah |
| 8,110,828 B2 | | 2/2012 | Achutharaman et al. |
| 8,163,090 B2 | | 4/2012 | Basol |
| 8,168,256 B2 | | 5/2012 | Eser et al. |
| 8,184,963 B2 | | 5/2012 | Wendt et al. |
| 8,415,559 B2 | | 4/2013 | Basol |
| 2001/0022992 A1 | * | 9/2001 | Regittnig ................ C23C 14/26 427/250 |
| 2002/0090052 A1 | * | 7/2002 | Muller et al. ................... 378/37 |
| 2004/0261839 A1 | | 12/2004 | Gee et al. |
| 2005/0086238 A1 | | 4/2005 | Nevin |
| 2005/0109392 A1 | | 5/2005 | Hollars |
| 2005/0220999 A1 | | 10/2005 | Fuchs et al. |
| 2005/0244570 A1 | * | 11/2005 | Tanase ..................... C23C 14/12 427/10 |
| 2006/0053032 A1 | | 3/2006 | Weiler et al. |
| 2006/0053128 A1 | | 3/2006 | Gestrelius et al. |
| 2006/0121701 A1 | | 6/2006 | Basol |
| 2007/0102035 A1 | * | 5/2007 | Yang ............................ 136/244 |
| 2007/0121124 A1 | * | 5/2007 | Nabatova-Gabain et al. ............... 356/630 |
| 2007/0159065 A1 | | 7/2007 | Yan et al. |
| 2007/0232065 A1 | * | 10/2007 | Basol ........................... 438/687 |
| 2007/0277875 A1 | * | 12/2007 | Gadkaree et al. ............ 136/256 |
| 2009/0033503 A1 | | 2/2009 | Emilsson |
| 2009/0092744 A1 | | 4/2009 | Pinarbasi et al. |
| 2009/0291231 A1 | | 11/2009 | Wieder |
| 2010/0248420 A1 | | 9/2010 | Okamura et al. |
| 2011/0073186 A1 | | 3/2011 | Lai et al. |
| 2011/0106902 A1 | | 5/2011 | Jagoe et al. |
| 2011/0148346 A1 | | 6/2011 | Gagosz et al. |

FOREIGN PATENT DOCUMENTS

| | | |
|---|---|---|
| EP | 394128 A2 | 10/1990 |
| EP | 0683532 A2 | 11/1995 |
| EP | 0884432 A2 | 12/1998 |
| EP | 1148149 A2 | 10/2001 |
| JP | 2006307278 A | 11/2006 |
| WO | 2004051734 A1 | 6/2004 |
| WO | 2005086238 A1 | 9/2005 |
| WO | 2006053032 A1 | 5/2006 |
| WO | 2006053128 A2 | 5/2006 |
| WO | 2007072023 A1 | 6/2007 |
| WO | 2007099138 A1 | 9/2007 |
| WO | 2007106756 A2 | 9/2007 |
| WO | 2008042682 A2 | 4/2008 |
| WO | 2009/029901 A1 | 3/2009 |
| WO | 2009084888 A2 | 7/2009 |
| WO | 2010032465 A1 | 3/2010 |

OTHER PUBLICATIONS

Final Office Action dated Apr. 3, 2013, U.S. Appl. No. 12/677,665.
Goodhew, Peter. "Electron Microscopy and Analysis", 3rd ed. New York: Taylor and Francis, 2001. pp. 170-175.
Alberts et al. "X-Ray Fluorescence Investigation of the Ga Distribution in Cu(In,Ga) Set Thin Films", Solar Energy Materials & Solar Cells 64 (2000) 371-383.
Bekker et al. "Properties of CuIn (Se, S)2 Thin Films Prepared by Two-Step Growth Processes", Thin Solid Films 431-432 (2003) 116-121.
Bruker, et al. An Overview of XRF Basics—Introduction to X-Ray Flourescence (XRF). (c) 2006, Web Implementation by MacCetera LLC.
Eisgruber et al. "In Situ X-Ray Fluorescence Used for Real-Time Control of CuInxGa1-xSe2 Thin Film Composition", Thin Solid Films 408 (2002) 64-72.
Eisgruber et al. "In-SITU Measurements of Cu(in,Ga)Se2 Composition by X-Ray Flourescence", 0-7803-5772-8/00. 2000 IEEE.
Fernandez-Ruiz et al. "Determination of the Stoichiometry of CuxInySez by Total-Reflection XRF", Sep. 25, 2001.

(56) References Cited

OTHER PUBLICATIONS

H.-J. Esche et al. "Rontgenfluoreszenz-Beschichtungsmessung im Vakuum-Prozess", X-Ray Fluorescence Coating Measurements in Vacuum Processes. Vakuum in Forschung und Praxis 14 (2002) Nr. 3 165-168.

I.L. Eisgruber "In-Situ Sensors for Process Control of CuIn (Ga)Se2 Module Deposition", Final Report, Aug. 15, 2001.

ITN HomePage CIGS Process Control. (http://www.itnes.com/x.php?page=13).

Jordan et al. "Short Communication: New Generation of High-Efficiency Solar Cells: Development, Processing and Marketing", Progress in Photovoltaics Research and Applications, vol. 2, 171-176 (1994).

Joshi, et al. "Real-Time Control of Thin-Film Photovoltaics Process", 46th Annual Technical Conference Proceedings (2003) ISSN 0737-5921.

Junker, et al. "Manufacture of Thin-Film Solar Cells: Modeling and Control of Cu(InGa)Se2 Physical Vapor Deposition onto a Moving Substrate", Ind. Eng. Chem. Res. 2004, 43, 566-576.

Junker, et al. "Mass and Heat Transfer Modeling of a Physical Vapor Deposition Effusion Source", Process Systems Engineering. Mar. 2005, vol. 51, No. 3.

Klenk et al. "X-Ray Fluorescence Measurements of Thin Film Chalcopyrite Solar Cells", Solar Energy Materials & Solar Cells 58 (1999) 299-319.

Klenk, et al. "Control of Two-Step Growth Processes of Chalcopyrite Thin Films by X-Ray Fluorescence Spectroscopy", Applied Surface Science 173 (2001) 62-68.

Kohara, et al. "Preparation of Device-Quality Cu(In, Ga)Se2 Thin Films Deposited by Coevaporation with Composition Monitor", Jpn, J. Appl. Phys. vol. 34 (1995) pp. 1141-1144.

Kuo et al. "Metalized Polymer Substrate for Flexible Amorphous Silicon Solar Cell", Industrial Technology Research Institute, Material Research Labatories. CH3365-4/94/0000-0690 (c) 1994 IEEE.

L. Simpson. "Trajectory Oriented and Fault Tolerant Based Intelligent Process Control for Flexible CIGS PV Module Manufacturing", Phase 1 Final Technical Report. Mar. 2003.

Nishitani, et al. "Composition Monitoring Method in CuInSe2 Thin Film Preparation", Thin Solid Films 258 (1995) 313-316.

Repins et al. "In Situ Sensors for CIGS Deposition and Manufacture", Mater, Res. Soc. Symp. Proc. vol. 865 (c) 2005 Materials Research Society.

Rudmann et al. "Effects of Sodium on Growth and Properties of Cu(In, Ga)Se2 Thin Films and Solar Cells". DISS. ETH Nr. 15 576. 2004. pp. 199.

Simpson et al. "Trajectory-Oriented and Fault-Tolerant-Based Intelligent Process Control for Flexible CIGS PV Module Manufacturing", Final Technical Report, May 13, 2002-May 30, 2005.

Spemann et al. "Elemental Depth Profiling in Cu(In,Ga)Se2 Solar Cells Using Micro-PIXE on a Bevelled Section", Nuclear Instruments and Methods in Physics Research B 231 (2005) 440-445.

International Search Report, PCT/IB2012/051926 dated Oct. 31, 2012.

International Search Report, PCT/IB2011/052321 dated Oct. 14, 2011.

International Search Report, PCT/EP2007/059600 dated Jun. 12, 2008.

International Search Report, PCT/CH2010/000057 dated Apr. 4, 2012.

Leigh C. Duran, "X-Ray Fluorescence Measurements of Molten Aluminum Elemental Composition", Materials Science and Engineering. Dec. 2007.

Rei Kitamura et al. "Optical Constants of Silica Glass From Extreme Ultraviolet to Far Infrared At Near Room Temperature", Applied Optics, vol. 46, Issue 33, pp. 8118-8133 (2007).

M. Rubin, "Optical Constants and Bulk Optical Properties of Soda Lime Silica Glasses for Windows", Solar Energy Materials, vol. 12, Jun. 1984.

\* cited by examiner

METHOD FOR MANUFACTURING A COMPOUND FILM

CROSS-REFERENCE TO RELATED APPLICATIONS

This application is a continuation of co-pending U.S. patent application Ser. No. 12/677,665, filed Mar. 11, 2010, which claims benefit of United States National Phase Application, Application number PCT/EP2007/059600), filed Sep. 12, 2007, which are both hereby incorporated herein by reference.

BACKGROUND OF THE INVENTION

Field of the Invention

The present invention is related to a method for manufacturing a compound film according to the preamble of claim 1. More particular, the present invention is related to a method for measuring physical parameters of thin films, where the measurement takes place during or after film growth and where the measurement results are used for controlling film deposition processes. The invention also relates to a method for deposition of one or several thin films using vacuum deposition processes for the manufacturing of thin-film solar cells and modules, which are based on absorber layers typically containing the elements copper, indium, gallium, and selenium.

The generation of environmental-friendly energy by means of photovoltaic cells (solar cells) has received growing interest in recent years. Solar cells generate energy by converting light, typically sunlight, into electricity, and fulfill the demands on a sustainable, renewable energy technology. Standard solar cell technology today is based on crystalline or multi-crystalline silicon absorbers, for the production of which a comparatively high amount of material and energy is required, which in turn limits the production cost potential. Thin-film solar cell technologies have proven to have a high potential for low-cost production while also achieving high light-to-electricity conversion efficiencies, a particularly promising candidate being based on the material copper-indium-gallium-diselenide. Especially promising is the deposition of solar cells using a roll-to-roll deposition technology, which allows quasi-continuous processing. In order to achieve low production costs, a high production yield is mandatory. Hence, mass production of solar cells must be very reliable and a good production process control is crucial, in particular control of the absorber deposition process. With a given manufacturing process, it is crucial to achieve cells and modules with highest conversion efficiencies (also called cell or module efficiencies or simply efficiencies). The efficiency is the most important parameter to characterize the performance or energy conversion quality of a solar cell or module.

A typical CIGS solar cell is based on the semiconductor layer CIGS, which can be Cu(In,Ga)Se$_2$. A GIGS layer needs to be deposited onto a back contact layer, or onto a stack of back contact layers, which in turn is deposited onto a substrate with or without additional intermediate coatings.

FIG. 1 shows a CIGS solar cell structure: A supporting structure, the substrate 1, for example, a polymer or metal foil or sheet or a glass sheet, is coated with a back contact film 2, for example made of Mo or another electrically conducting material or compound. The alkali-metal-containing CIGS absorber layer 3 is deposited thereafter onto the structure, where the alkali atoms are added to the GIGS by diffusion from underlying layers (not shown in FIG. 1) or from the substrate during CIGS growth, by co-deposition during GIGS growth, or by diffusion after CIGS growth. The CIGS layer is coated by a buffer layer 4 made of CdS or related compounds such as Cd(O,OH,S) or of ZnS, ZnO, In$_2$S$_3$, or of other compounds. As a next layer, a front contact or window layer 5 is deposited, typically consisting of a bi-layer of intrinsic ZnO (i-ZnO) and a transparent conducting oxide (TCO), such as doped ZnO (e.g. ZnO:Al) or indium tin oxide (ITO), or consisting of a single layer such as a TCO alone. In-between the deposition steps, one or several patterning steps may be applied, where layers are structured such that individual solar cells are connected in parallel and/or series, resulting in arrays of solar cells, which are called "modules". Grid structures 6 that can assist carrier collection and can make contact to adjacent cells may be deposited after deposition of the window layer. An anti-reflection coating 7 may be deposited on top in addition. Not all layers described here need to be deposited in a production process in order to get a working solar cell. Especially for economic or practical reasons or to enhance the cell performance, some layers can be omitted or others can be added, where the efficiency of the solar cells and modules may be affected or not.

The deposition of CIGS solar cells and monolithic integration into modules is described, for example, in U.S. Pat. No. 5,078,804 and by Mitchell, Proceedings of the 20th IEEE PV Conference 1988, pp. 1384-1389, respectively.

An economic way of producing thin-film solar cells and modules is to use in-line processing, where batches of individual substrates 1 move one after the other through one or several deposition zones in a deposition chamber 8 (FIG. 2), such that the deposition processes are kept running continuously while the substrates get progressively coated as they move further through the deposition zones, as it is depicted in FIG. 2(a). Several deposition chambers 8 may be lined up in sequence, and one or several adjacent chambers 9, typically containing substrate manipulation mechanisms or measurement devices, may be added on either side of each deposition chamber.

A potentially even more economic way of producing thin-film solar cells and modules is to use flexible substrates such as metallic, polymeric, glassy, or ceramic foils, and to coat said flexible substrates with the solar cells or modules using roll-to-roll deposition technology, as it is depicted in FIG. 2(b). With roll-to-roll deposition, large substrate areas can be coated without the need of interrupting or changing the deposition process over long periods of time. The substrate (also called "web") moves through one or several deposition zones and gets progressively coated as it moves further through the deposition zones.

The use of x-ray fluorescence (XRF) for thickness and/or composition measurement in thin-film technology is well known. The use of XRF for simultaneous multilayer thickness measurement for individual samples is described in U.S. Pat. No. 4,162,528, for example. The use of XRF in thin-film production systems is described in U.S. Pat. No. 6,611,576, where metal films deposited onto semiconductor wafers are characterized using XRF during growth, allowing to determine an end point and to stop the deposition once the determined film thickness reaches a preset value. The latter invention is useful for batch-to-batch deposition systems, where one batch of samples is processed until an end point is reached, before processing on the next batch starts. However, in a continuous-processing deposition system, like a roll-to-roll or in-line deposition system, an end point in the above sense is never reached and a deposition process is not stopped once a coating is completed.

CIGS deposition control has been addressed in WO 2005/086 238, where a transition of a Cu-rich GIGS layer into a Cu-deficient CIGS layer is detected in an in-line evaporation process. In this known teaching, an option to use XRF to measure overall film composition and thickness after the deposition zone in order to control the deposition process using a feedback signal is also described. In this connection, reference is made to the paper entitled "Manufacture of Thin-Film Solar Cells: Modeling and Control of Cu(InGa)Se.sub.2 Physical Vapor Deposition onto a Moving Substrate" by Junker et al. (Ind. Eng. Chem. Res. 2004, 43, pp. 566-576), in which a method is disclosed that allows controlling one evaporation source for each metal, e.g. evaporation sources arranged in the sequence Cu—Ga—In or Ga—Cu—In. The known teaching does not allow measuring material gradients in the CIGS layer, or controlling all evaporation sources when arranged in sequences such as Ga—Cu—In—Ga, for example. Instead, XRF is described for the case of several evaporation sources distributed across the width of the substrate (perpendicular to the traveling direction of the substrate), and it is described how to use the XRF for controlling the individual sources.

WO 03/038 871 A1 (or US-2003/082 834 A1) discloses method for optical process control based on reflectometry for CIGS deposition.

EP-0 394 128 31 discloses a movable x-ray source and the measurement of x-ray transmission through a substrate using a feedback loop.

A method for composition depth profiling of CIGS films using XRF is described by V. Alberts et al. (Solar Energy Materials & Solar Cells Vol. 64 (2000), p. 371-383), where XRF is applied in several steps on progressively etched CIGS films after growth. This treatment destroys the sample and is therefore not suited for non-destructive deposition-process control.

I. L. Eisgruber et al. (Conference Record of the 28.sup.th IEEE Photovoltaic Specialists Conference, 2000, p. 505-508) describe the use of XRF for standard in-line thickness and overall-composition measurement in a CIGS production process.

In the case of a deposition process where two or more atomic species form a compound, such as a CIGS deposition process, a film thickness measurement in combination with a film overall-composition measurement allows to determine the absolute amount of atoms of each species present in the layer. Hence, if all atoms of one species in the film stem from only one deposition source, e.g. as it is depicted in FIG. 3(a), and if overall-composition and/or thickness deviate from a desired, pre-defined value then corrective action on one or several of the sources can be taken. This is the case for example, when CIGS is deposited from three metal sources, i.e., from one Cu, one In, and one Ga source (the precise control of Se deposition rate is normally not required for typical CIGS layers, therefore it is not considered here and just assumed to happen satisfactorily independent of metal source control).

However, if the atoms of one species in the film stem from more than one deposition source, typically from a second, similar deposition source, e.g. as it is depicted in FIG. 3(b), in which a second A-source 12, depositing a material A, is present, then the film overall-composition and thickness measurement performed by a measurement device 10 does not allow separating the contributions from the two similar A-sources anymore. Therefore, it is not clear, which of the A-sources needs corrective action, and source control is no more possible for all deposition sources.

In the example of CIGS deposition using one Cu, one In, and one Ga source, said control problem occurs as soon as a second Cu, In, or Ga source is added to the three metal deposition sources.

For example, if a second Ga source is added to the Cu, the In, and the Ga source, the overall-composition and thickness measurement signal can only tell how much Ga there is in the film, but not how much of the measured Ga was supplied by the first Ga source and how much by the second Ga source.

As a second example, sources arranged in the sequence In—Ga—Cu—In do not permit separate control of the In sources with merely a thickness and overall-composition measurement after film deposition.

It is well known to those skilled in the art that compositional gradients in GIGS films can exist and that they can have a significant influence on the solar cell conversion efficiency. In particular, the deposition of GIGS films in a way such that Ga/In compositional gradings occur can be advantageous. For example, when the Ga/In concentration ratio increases towards the back contact, which is called "back grading" or "normal grading" (see FIG. 4(b)), electron collection in the CIGS during solar cell operation is supported, which benefits the cell efficiency. When the Ga/In concentration ratio increases towards the buffer layer ("front grading"), the voltage of the device is enhanced, which again benefits the cell efficiency.

Particularly beneficial is the combination of a back and a front grading to a "double grading", as it is depicted in FIG. 4(c).

If CIGS is deposited from only one deposition source for each metal, e.g. from sources in the sequence Ga—Cu—In or In—Cu—Ga, either no front grading or no back grading is achieved. FIG. 5(a) shows such a configuration. In order to achieve both gradings, i.e. a double grading, an additional metal deposition source is required, for examples a second Ga source enabling the sequence Ga—Cu—In—Ga (or Ga—In—Cu—Ga). Such a configuration is depicted in FIG. 5(b). However, as described above, when a second Ga source (or any other second similar source) is used, individual control of two similar deposition sources is no more possible with merely a thickness and overall-composition measurement. Similarly, if other deposition source sequences are desired, such as Ga—In—Ga—Cu, Ga—In—Cu—In, Ga—In—Cu—In—Ga, or any other combination, the control problem remains the same.

In addition, for example to increase the throughput of the deposition machine or to shape the compositional profiles of the as-deposited films more accurately, it may be desirable to have a sequence of several "blocks" 13 of deposition sources 12, where every deposition-source block contains an array of deposition sources in a certain sequence, for example Ga—In—Cu followed by Cu—In—Ga, or Ga—In followed by Cu—In—Ga, or as depicted in FIG. 6. Any combination of sources and blocks can be used in a deposition process. An array of deposition-source blocks may be placed within one deposition chamber 8, within consecutive deposition chambers, or within one or several deposition chambers having an internal separation feature 14 such as a shield or wall. As described above, as soon as one material is deposited by more than one deposition source before an overall-thickness and composition measurement is performed, the control problem occurs.

When there are several deposition-source blocks, a known measurement device usually needs to be placed after every block. Since known measurement devices are heat-sensitive and since metal evaporation sources have to be operated at temperatures in the vicinity of 1000.degree. C. or above, evaporation-source blocks cannot be placed close to each other because room is required for protection of the measurement devices from material deposition and heat radiation. Hence, deposition machines can become very large and complicated, and the film stack may cool down while moving through the measurement zone before reaching the following evaporation-source block.

It is therefore one object of the present invention to control deposition of compound films comprising at least two chemical elements.

This and other objects are obtained by the features given in the characterizing part of claim 1. Further embodiments as well as an apparatus are given in further claims.

Throughout the following description, the term CIGS must be understood as a typical CIGS solar cell that is based on the semiconductor layer CIGS, which can be Cu(In,Ga)Se.sub.2 or a related compound formed from any combination of the elements Cu, Ag, In, Ga, Al, Se, S, To yielding a semiconductor in the form (Cu,Ag).sub.x(In,Ga,Al).sub.y(Se,S,Te).sub.z, for example, the compound Cu(In,Ga)(Se,S).sub.2. It is understood that this class of compounds also comprises non-stoichiometric compounds such as Cu.sub.0.9(In,Ga).sub.1.1Se.sub.2, or Cu(In,Ga).sub.3Se.sub.5, etc., over wide ranges of compositions. Such compounds typically, but not always, contain a small amount of an alkali metal—added on purpose actively or passively—for example Na, K, or Li.

The present invention is directed to a method for manufacturing a compound film comprising a substrate and at least one additional layer, the compound film satisfying predefined compound film properties, in particular being predefined values for compound-film thickness, compound-film overall composition and compositional profile, the latter being defined as a compound-film composition as a function of a position on or in the compound film. The method comprising the steps of: depositing at least two chemical elements on the substrate and/or on the at least one additional layer using depositions sources, maintaining depositing of the at least two chemical elements while the substrate and the deposition sources are being moved relative to each other, measuring the compound film properties, particularly being compound film thickness, compound-film overall composition, and compound-film composition in one or several positions of the compound film, comparing the predefined values for the compound film properties to the measured compound film properties, and adjusting the deposition of the at least two chemical elements in case the measure compound film properties do not match the predefined compound film properties.

In an embodiment of the present invention, the method is characterized in that the substrate is a flexible foil, made at least in part of metal, polymer, or ceramic, and that said foil can be rolled up.

In a further embodiment of the present invention, the method is characterized in that the substrate is at least partially coated by one or several additional layers.

In a still further embodiment of the present invention, the method is characterized in that the substrate is a plate of a material that is at least partially made of glass, metal, or polymer, and wherein the plates are continuously fed, one after the other, in order to be coated.

In yet another embodiment of the present invention, the method is characterized in that the substrate is coated by one or several additional layers, wherein the same or different coatings can be applied on either side of the substrate.

In yet another embodiment of the present invention, the method is characterized in that the step of measuring the compound film properties is performed by a measurement device that is moved in directions perpendicular and/or parallel to a traveling direction of the substrate, enabling measurements at different locations of the substrate, in particular across an entire width of the substrate.

In yet another embodiment of the present invention, the method is characterized by further comprising the step of individually adjusting a deposition rate of the deposition sources.

In yet another embodiment of the present invention, the method is characterized in that the deposition sources are arranged in a plurality of deposition-source blocks.

In yet another embodiment of the present invention, the method is characterized in that at least a part of the measurement device is arranged opposite to the deposition sources with regard to the substrate. Therewith, the measurement device is protected from being coated and can be brought very close to the substrate or even touching the substrate without the risk of scratching the film.

In yet another embodiment of the present invention, the method is characterized by positioning the measurement device in-between deposition-source blocks.

In yet another embodiment of the present invention, the method is characterized in that the step of adjusting the deposition source is performed by modifying temperature, power supply or gas supply.

In yet another embodiment of the present invention, the method is characterized in that the measurement device comprises an x-ray detector for detecting characteristic fluorescence radiation from appropriately excited atoms in the substrate and/or any of the additional layers, where said x-ray detector is capable if distinguishing the energies or wavelengths of the radiation and of the respective radiation intensities.

In yet another embodiment of the present invention, the method is characterized in that the measurement device comprises an excitation source, which excites atoms in fractions or all of the compound film and possibly also in a part or all of the substrate.

In yet another embodiment of the present invention, the method is characterized in that the excitation source is an electron source, where the penetration depth of the electrons can be adjusted by changing the electron acceleration voltage.

In yet another embodiment of the present invention, the method is characterized in that the excitation source is an x-ray source, where at least a part of the exciting x-rays are high enough in energy to induce K and L lines in the fluorescence spectrum of at least a part of the excited atom species.

In yet another embodiment of the present invention, the method is characterized in that the excitation source comprises an x-ray source in combination with an electron source, where the x-ray source is capable of exciting atoms in all additional layers and in the substrate, while the electron source is capable of exciting only parts of the additional layers and/or the substrate.

In yet another embodiment of the present invention, the method is characterized in that the compound film is a polycrystalline semiconductor compound of the form (Cu,Ag)(In,Ga,Al)(Se,S).sub.2, particularly the compounds Cu(In,Ga)Se.sub.2 or Cu(In,Ga)(Se,S).sub.2.

In yet another embodiment of the present invention, the method is characterized in that the substrate is a polyimide foil, which is particularly transparent for x-ray radiation, coated by an electrically conductive layer consisting of a single material.

In yet another embodiment of the present invention, the method is characterized in that the electrically conductive layer on the foil is made of Mo.

In yet another embodiment of the present invention, the method is characterized in that the electrically conductive layer on the foil is made of a metal nitride.

The present invention improves deposition control for deposition of compound films comprising at least two chemical elements, such as CIGS. The invention increases the degree of freedom, to which elemental deposition profile shapes can be created, and enables to ensure consistent and reliable film properties. The deposition control improvement is achieved by employing one or several measurement sensors, together forming one measurement device, which allow determining film thickness, average film composition of the complete film (overall composition), as well as film composition in one or several fractions of the layer.

The measurement device can be a fluorescence spectrometer, where the fluorescence radiation to be detected is x-ray radiation. Such a measurement is non-destructive and hence does not cause material quality loss in the probed portions of the films. The essential components of such a spectrometer typically are an excitation source (or alternatively at least two excitation sources) and a detector, all aligned in a way suitable for efficient measurement-signal detection and properly cooled and shielded. Source and detector do not necessarily have to be in the same housing, they can also be spatially separated, for example, they can be placed one on the back and one on the front side of the film to be probed. The excitation source typically emits x-rays or electrons. The detector detects the wavelengths of the fluorescence radiation and the intensities of the radiation of such wavelengths. Alternatively, instead of wavelengths, the detector may be sensitive to the energies or frequencies of the fluorescence radiation, which in the end is equivalent to sensitivity to wavelengths due to the interrelation of radiation wavelength, energy, and frequency. The detector works usually either sequentially, e.g. by measuring one wavelength after the other, or simultaneously, e.g. by measuring all energies in the spectrum simultaneously with the help of a multi-channel analyzer. The wavelengths of the detected radiation are characteristic for the atom species present in the film. The intensity of radiation of a certain wavelength depends on the number of atoms of the corresponding atom species present in the probed part of the film. Hence, wavelength and intensity measurements allow quantifying the composition and, once the system has been calibrated, also the thickness of a film. Depending on the wavelengths of the excitation radiation and the film thickness, all or only a part of the film to be measured can be probed. Also depending on the wavelength of the fluorescent radiation, a negligible or significant part or the complete fluorescence signal of a certain wavelength is re-absorbed within the film (or in adjacent layers or in the substrate) and hence cannot reach the detector. With a suitable combination of excitation and fluorescence wavelengths, different fractions of the film (or the entire film) to be measured are probed. Ideally, several combinations are used at the same time, such that several fractions of the film are probed at the same time. Such a fluorescence spectrometer is capable of determining film thickness, film overall composition, and film composition in one or several fractions of the layer, either in one or else in consecutive measurement steps.

With reference to FIG. 3, the signals of the measurement device 10 can be used by a control device such as a computer 11 to determine whether or not the output of a deposition source, or of a part of a deposition source 12, needs to be adjusted or not. Adjustment of source output can be achieved, for example, by modification of the source temperature, the power fed to the source, or the gas environment of the source. The closer to the deposition zone a measurement device can be positioned, i.e., the shorter the way a certain portion of a film needs to travel to come past the measurement device, the sooner the decision about the need for adjustment can be taken, which prevents more effectively the occurrence of faulty deposition and eventually of low production yield.

The present invention is further described in the following by referring to drawings showing exemplified embodiments.

FIG. 1 schematically shows a known CIGS solar cell in a cross-sectional view.

FIG. 2a schematically illustrates a deposition process step in a chamber using in-line processing.

FIG. 2b schematically illustrates a deposition process step in a chamber using roll-to-roll processing.

FIG. 3 schematically shows a deposition process control using a feedback signal, where film properties are measured after the deposition process is finished in the same or a separate chamber. Several deposition sources for different materials A, B and C are sketched in example (a), while in example (b) a further deposition source depositing the same material A as one of the other deposition sources is added.

FIG. 4 is a schematic illustration of band-gap grading concepts in CIGS or similar compounds. VBM=valence band maximum, CBM=conduction band minimum. Eg=band gap; the dot represents an electron being guided by the gradient in the CBM. (a) no grading, (b) normal grading (=back grading), (c) double grading(=back grading+front grading).

FIG. 5 is a schematic illustration of possible deposition source arrangements for a CIGS deposition process: (a) three metals sources, (b) four metals sources. For both cases, an example for deposition-rate profiles for each element, an example for the corresponding Ga/(In+Ga) concentration-ratio profile through the film, and an example for the effect on the band-gap (Eg) profile through the film is shown: (a) back grading, (b) double grading. VBM=valence band maximum, CBM=conduction band minimum.

Figure 9:
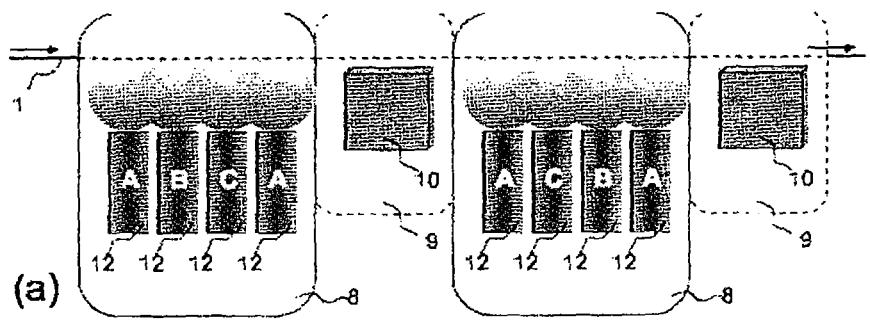
Figure 9:
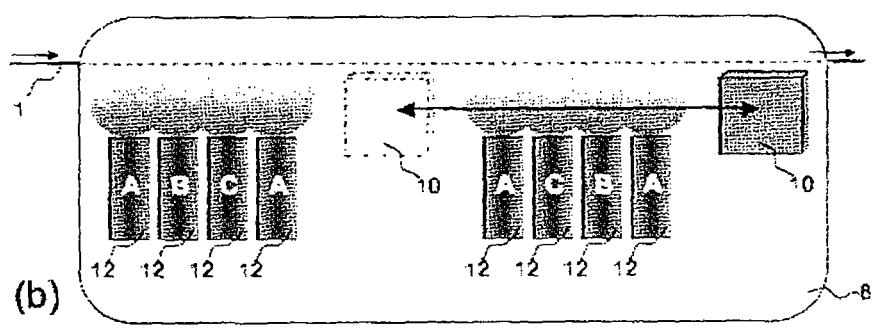

FIG. 9 is a schematic illustration of a section of a deposition chamber, as seen by looking parallel to the plane of the substrate: (a) after every deposition-source block a measurement device is placed, which can also move perpendicular to the traveling direction of the substrate (into the plane of the paper); (b) one measurement device, which can also be moved parallel to the traveling direction of the substrate, is used to measure after every deposition block.

Figure 10:
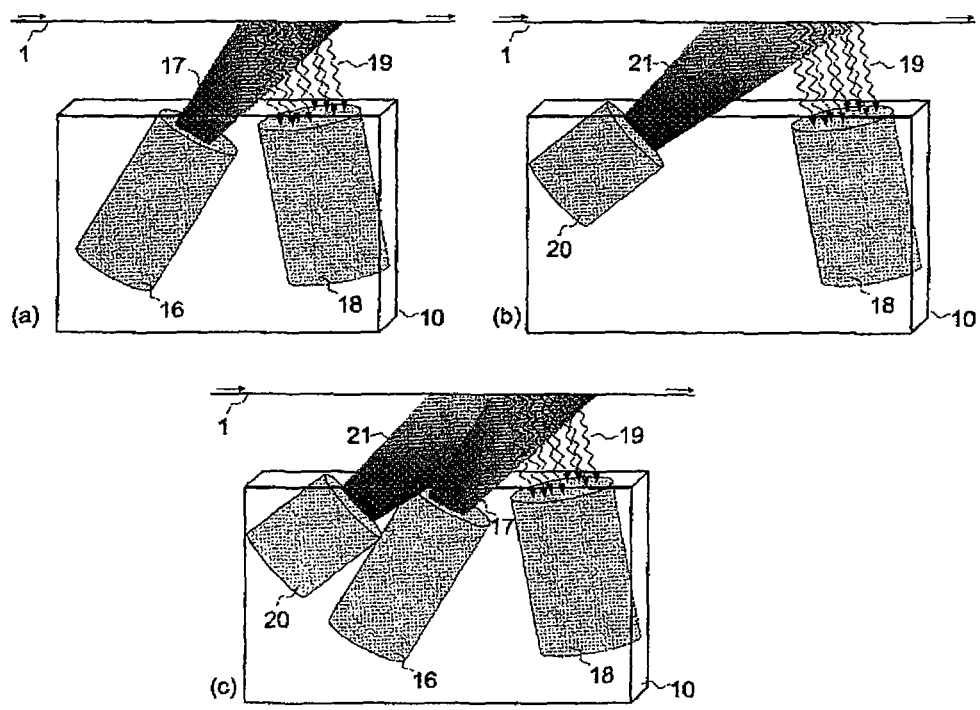

FIG. 10a is a schematic illustration of a measurement device comprising an x-ray source and an x-ray detector.

FIG. 10b is a schematic illustration of a measurement device comprising an electron source and an x-ray detector.

FIG. 10c is a schematic illustration of a measurement device comprising an electron source, an x-ray source, and x-ray detector.

Figure 11:
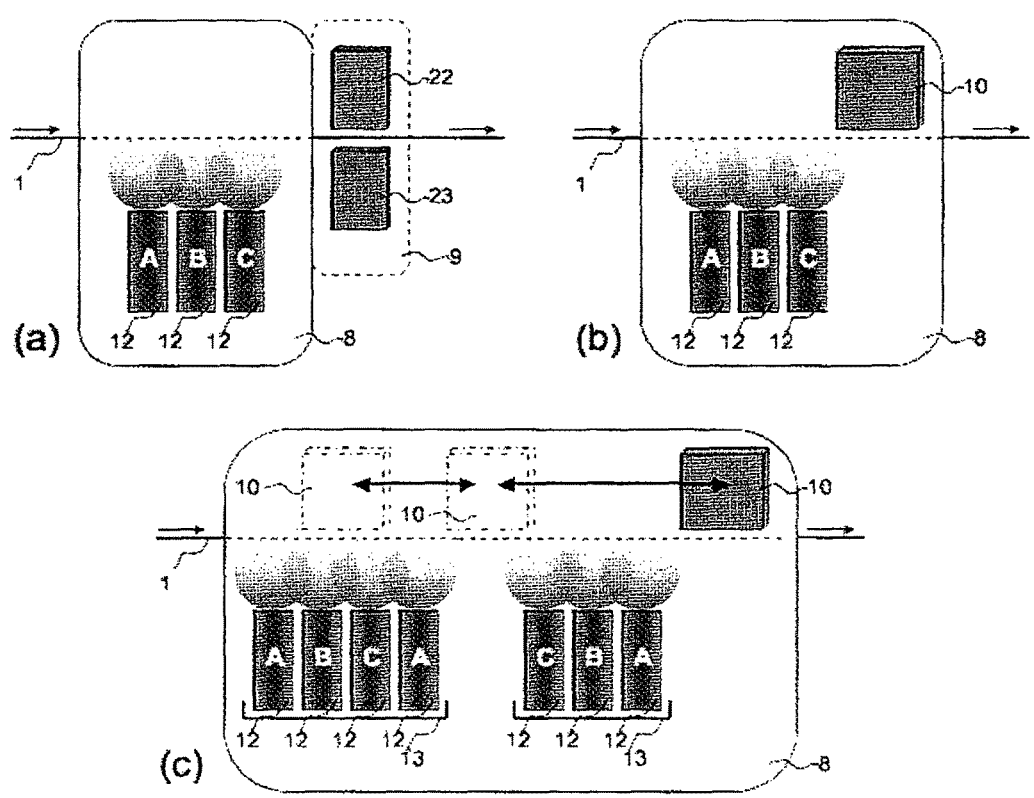

FIG. 11 is a schematic illustration of possible ways of placing a measurement device such that the substrate is located in between the deposition sources and the measurement device or parts of the latter, wherein the measurement device is partially placed behind substrate according to FIG. 11a, wherein the measurement device is completely behind the substrate according to FIG. 11b, and wherein the measurement device is behind the substrate, moving between deposition source blocks, or into deposition zone, according to FIG. 11c.

A method is disclosed that improves deposition control such that the number of installed, controllable deposition sources requiring precise control can be increased without having to increase the number of measurement devices, and such that the flexibility for placement of such deposition sources and for source arrangements is enhanced.

Figure 5:
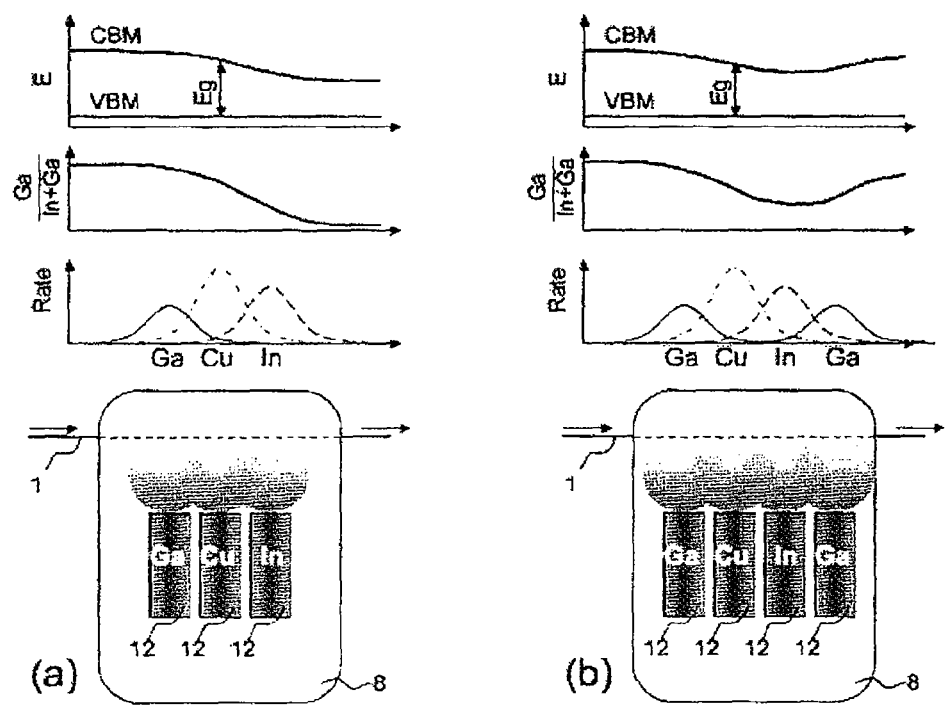
Figure 6:
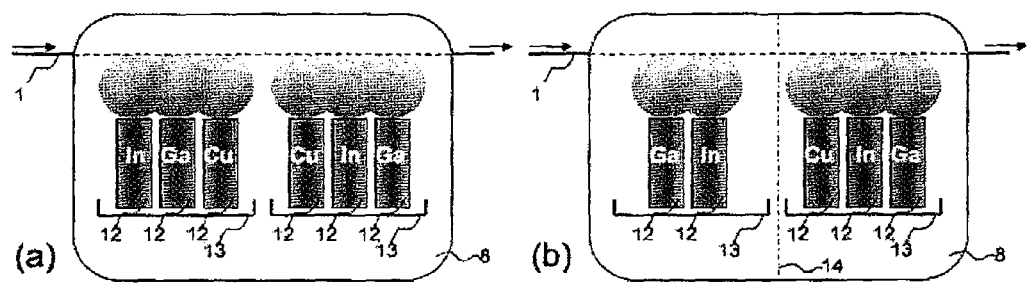
FIGS. 6a and 6b are schematic illustrations of possible deposition source arrangements within a deposition-source block, and of possible deposition-source block arrangements within a deposition chamber. The deposition-source blocks could also be located in individual chambers.

For example, instead of three deposition sources 12 in FIG. 5a, a fourth deposition source can be controlled (FIG. 5b). This enhanced flexibility allows to reliably deposit films (or layers) with well-defined and particularly beneficial compositional gradients (see FIG. 5). As possible consequences, higher solar cell and module conversion efficiencies can be achieved and/or the thickness of the film can be reduced without or with reduced loss in conversion efficiency. This is realizable by using a measurement device capable of determining compound-film thickness, compound-film overall composition, and compositional profile, the latter being defined as a compound-film composition as a function of a position on or in the compound film.

A further embodiment of the present invention uses a measurement device 10 comprising, for example, an x-ray source 16 and an x-ray detector 18, placed in the same housing as the detector depicted in FIG. 10a, or in different housings, for example one part identified by 22 comprising the detector above the substrate 1 and one part identified by 23 comprising the source below the substrate 1, as schematically illustrated in FIG. 11a. The x-ray source 16 may emit monochromatic or broadband x-ray radiation 17. The radiation 17 of the x-ray source 16 is used to excite atoms in all layers and in the substrate 1. The excited atoms relax by emitting fluorescent radiation 19 of discrete wavelengths. A part of this fluorescent radiation 19 is in the x-ray regime and is therein classified according to the transitions in the radiating atoms as K, L, M, etc. lines. The K lines of the fluorescent radiation 19 are those with the smallest wavelengths and usually the highest penetration depths (the lowest absorption coefficients) in a material. Typically, the absorption of K lines within a layer of about 1 .mu.m can be neglected; hence K lines can be taken to measure the total number of atoms of a certain element in the complete film. The L lines, however, occur at higher wavelengths, where absorption within a layer is significant. The intensity of L-line radiation in a material falls exponentially due to the absorption. In a layer of about 1 .mu.m thickness, the L-line radiation can be completely absorbed within the film such that it cannot be detected anymore. Even if the penetration depth of L-line radiation is larger than the film thickness, there will still be significantly more L-line radiation from atoms closer to the surface, due to the exponential intensity decrease with thickness. The typical penetration depth of L-line radiation from a particular element in a material varies from element to element and from material to material. However, in most cases, K-line fluorescence radiation detected outside the film by a detector will stem from atoms distributed throughout the film, while L-line fluorescence radiation will stem from atoms located closer to the surface. In this way, composition in different depths of one or several films can be measured. In particular, the measurement is sensitive to changes in the compositional profile, which is what is primarily needed for process control: Any change of the deposition process should be detectable and allow corrective action to be taken.

As an example, a GIGS film with a Ga/In compositional double grading through the film can be characterized by using the In K lines for measurement of total In content in the film (corresponding to the average In concentration) and using the In L lines for measurement of the In content in the top part of the film.

Alternatively, the same measurement could be done correspondingly with Ga lines instead of In lines, or with Ga lines in addition to the In lines.

Another embodiment uses a measurement device 10 comprising an electron source 20 and an x-ray detector, placed in the same housing as the one in FIG. 10b, or in different housings, for example one part above the substrate 1 and one part below the substrate 1. The electrons 21 of the electron source 20 are used to excite atoms in certain parts of the film or films. The penetration depth and the excitation region and volume in a film are determined by the energy of the impinging electrons and by the material properties of the probed film. Hence, by changing the energies of the electrons 21 from the electron source 20, for example by changing the electron acceleration voltage, atoms in different depths of a film are excited. By employing an x-ray detector 18 measuring K lines only, or K and L lines, fluorescence radiation 19 from the excited atoms can be detected and hence composition in different depths of one or several films can be measured. In particular, the measurement is sensitive to changes in the compositional profile.

For example, in the case of a double-graded CIGS film, by using different electron acceleration voltages, a rough depth profile of the In/Ga concentration ratio can be established. Any changes in that profile are detectable and allow adjusting the deposition-process parameters.

Yet another embodiment uses a measurement device 10 comprising an x-ray source 16, an electron source 20, and an x-ray detector 18, placed in the same housing as in FIG. 10c or in different housings, for example one part above the substrate 1 and one part below the substrate 1. With this arrangement, the x-ray source 16 and the x-ray detector 18 can be used to measure overall composition and thickness, for example by analyzing K-line fluorescence radiation. The exciting electrons can penetrate into different depths of a film, where they excite further atoms, hence giving rise to additional contributions to the fluorescence radiation, for example, the K-line fluorescence radiation. When either the x-ray source 16 and/or the electron source 20 is switched off periodically or from time to time, then separation of the signals is possible and overall composition and thickness as well as depth profiles can be extracted from the measurements. In particular, the measurement is sensitive to changes in the compositional profile.

Figure 1:
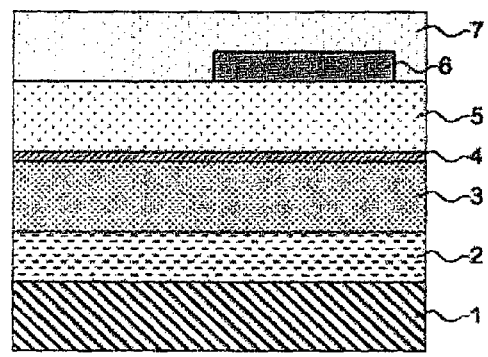
Figure 2:
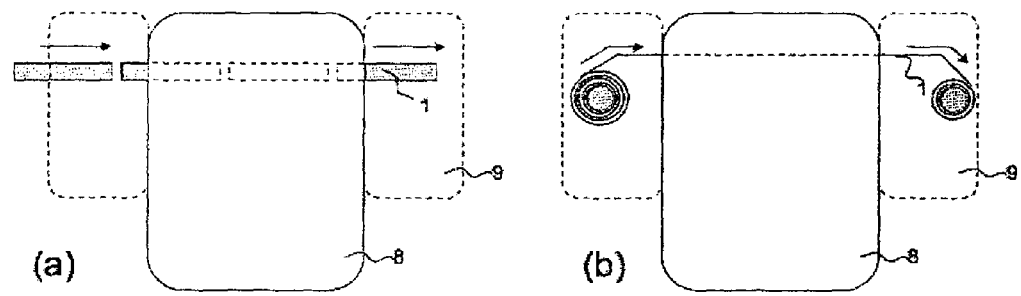
Figure 3:
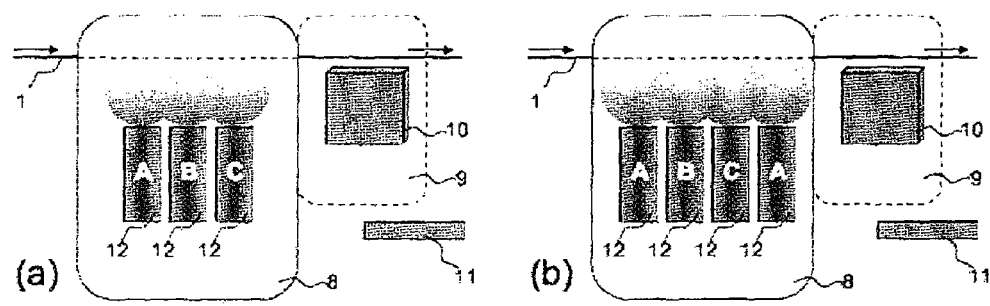
Figure 4:
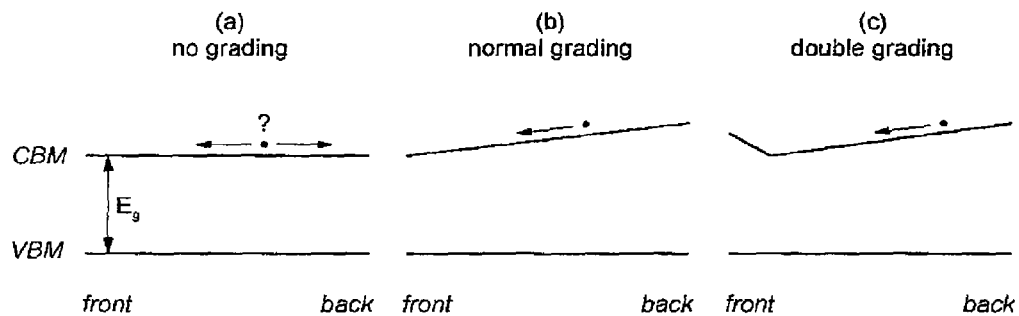

If during a deposition process, a control device such as a computer 11 receives signals from the measurement device 10 that are interpreted by the control device as a deviation of film thickness, film overall composition, and/or film compositional profile from pre-defined values, then the control device can take corrective action on the deposition process by feeding back a signal to the concerned deposition sources 12 (FIG. 3). The feedback signal can initiate a change or changes in material deposition rate of one or several deposition sources, or of a part or parts of one or several deposition sources. A change in material deposition rate of a source or a part thereof can be achieved, for example, by modification of the supplied heating or sputter power or by modifying the local gas environment (pressure). A fast feedback signal is advantageous in order to take corrective action on the deposition process quickly, which allows preventing effectively the occurrence of faulty deposition and eventually of low production yield. Once the corrective action has been taken, the control device can check if these actions lead to the desired results and take further corrective actions if required.

Figure 7:
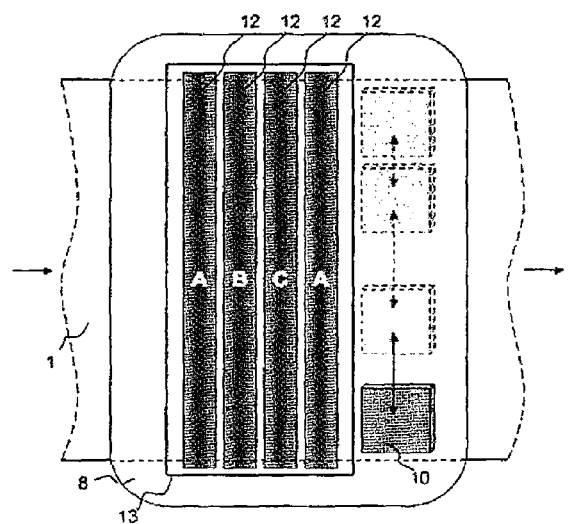
FIG. 7 is a schematic illustration of a section of a deposition chamber, as seen by looking onto the plane of the substrate, where a measurement device is moved perpendicular to the traveling direction of wide substrates to an arbitrary location, allowing the control of film properties across the full width of the substrate.
Figure 8:
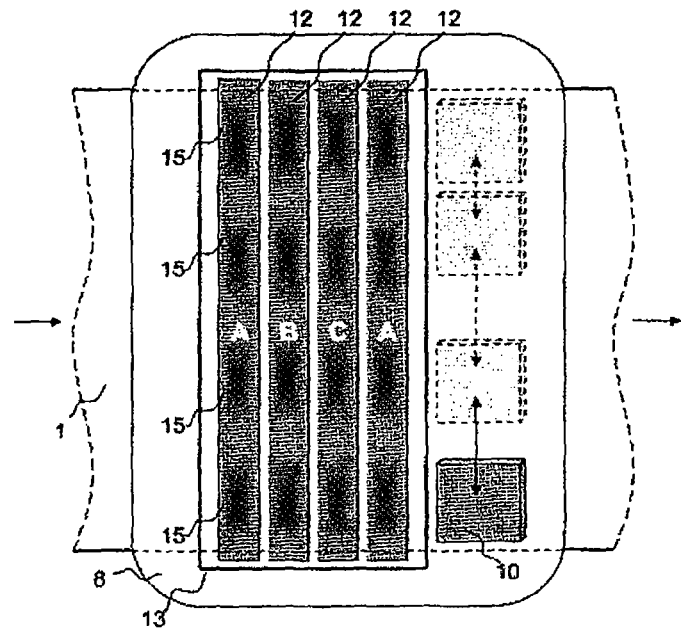
FIG. 8 is a schematic illustration similar to FIG. 7, but where the deposition sources consist of several deposition-source units.

A further embodiment of the present invention is disclosed which allows the control of film properties across the full width of wide substrates, perpendicular to the traveling direction of coated or uncoated substrates (FIG. 7). Such control enables fine-tuning the material output rates of a wide deposition source over the full width of the source, not only in one or few points. This is particularly important if the relative deposition rates in different locations of a wide deposition source change with time, for example, because the source's reservoir of material to be deposited changes or because local heating/cooling or pressure characteristics change. The method furthermore allows controlling and fine-tuning deposition sources 12 consisting of at least two narrower deposition-source units 15 of similar or differing design and arranged side by side with or without gaps in between (FIG. 8), for example, two or more narrower deposition-source units, or, as another example, an array of several point sources distributed along a line, where each point source corresponds to a deposition-source unit.

A still further embodiment of the present invention is disclosed, which allows the control of the deposition sources arranged in two or more deposition-source blocks, each block consisting of the same or a different arrangement of one or several deposition sources, by using only one or only few measurement devices. This is achieved by moving each measurement device 10 not only across substrates (perpendicular to the traveling direction of the substrates), but also parallel to the traveling direction of the substrates to measure also in-between deposition source blocks 13, such as illustrated in FIG. 9*b* for the case of two deposition-source blocks.

Another approach would be to use measurement devices 10 after every deposition-source block 13. But because good deposition sources do not change their deposition rate characteristics quickly, it is possible to sequentially employ only one measurement device in a large number of different locations. After completion of every measurement cycle, the measurement results can be compared to the results from previous measurement cycles and corrective actions on the deposition sources can be taken, if necessary. In this way, one or only few moving measurement devices suffice for controlling all deposition sources and hence can replace a larger number of non-moveable measurement devices.

A further embodiment of the present invention is disclosed, which allows to employ a measurement device close to or even in the deposition zone, enabling a feedback signal for deposition source control with minimum delay, or even enabling real-time deposition source control by measurement of film properties in the deposition zone, while the film is still being grown.

Good protection of the measurement device from thermal radiation, e.g. stemming from hot deposition sources, and appropriate shielding preventing material deposition on sensitive parts of the measurement device are necessary. A particularly suitable way to achieve this is to place the measurement device 10 (or parts 22, 23 thereof) behind the substrate, such that the substrate is located in-between the measurement device (or parts 22, 23 thereof) and the deposition sources, for example as illustrated in FIGS. 11*a* and 11*b*. In this way, the substrate protects the measurement device from material deposition and also to some extent from thermal radiation. When the entire measurement device is placed behind the substrate, it cannot interfere with the atomic flux from the deposition sources, hence it is possible to move consecutive deposition-source blocks closer together while still measuring with the measurement device in-between (FIG. 11*c*), with no shadowing effects as they would occur with a measurement device placed on the front side of the substrate.

Furthermore, placing a measurement device behind the substrate has the advantage that the measurement device can be positioned very close to or even touching the substrate. Because the measurement device is on the back side of the substrate, there is no risk of scratching sensitive, as deposited films. Having the measurement device placed close to the substrate means that the detection count rate of, for example, fluorescence radiation is high, since the count rate falls off rapidly with the square of the distance between film and detector. In turn, high count rates enable to use a short measurement time and hence to employ only one measurement device in many different locations.

Still a further method is disclosed that allows correcting fluctuations in the measurement device results stemming from excitation source and/or detector drift with time, and/or from variations in source-film and/or film-detector distances. Distance variations can occur especially due to the moving substrates, especially if the substrates are flexible, and due to a certain amount of irreproducibility in measurement device placement in different locations. In order to be able to correct the count rate fluctuations, the measurement signal from underlying layers, or from the substrate, needs to be analyzed as a reference signal. However, this signal often is received together with the main measurement signal and hence does not need any additional measurement sensors. If the layer or substrate giving rise to the reference signal, the "reference layer", should happen to be inhomogeneous in thickness, it is required that, prior to the measurement of the compound film properties using the measurement device, the thickness profile of the reference layer is determined and used to correct the signal from the measurement device. The thickness profile of the reference layer can already be determined during deposition of the reference layer, for example by using a well-known quartz crystal microbalance or of optical emission spectrometry. For example, when the compound film is CIGS for solar cell applications, the reference layer can be the back contact, typically Mo, or additional layers deposited prior to CIGS deposition or the substrate, or even a layer deposited on the back side of the substrate. If there are further layers in addition to the reference layer deposited prior to the compound film deposition, or if there are further layers and the reference signal stems from the substrate, the deposition processes of these further layers can be controlled using the same measurement device by feeding back the measurement information to the respective deposition sources. If the reference signal stems from a layer or substrate sufficiently thick, i.e. thicker than the penetration or exit length of the excitation or fluorescence radiation, then the thickness of this reference layer or substrate does not need to be known exactly, as long as it always is thick enough.

If, as the case may be, distance variations between the parts of the measurement device and the film can be neglected, the signal of the reference layer can be used to control the reference-layer-deposition process at the same time as the compound film deposition process. For example, when the compound film is CIGS for solar cell applications, the back contact can be taken as reference layer and the back contact deposition process (often Mo deposition by dc sputtering) can be controlled at the same time as the CIGS deposition process. Obviously, the time lag between deposition and measurement of the reference layer can become large, depending on the machine configuration. But if the reference layer does not need very tight control, such as Mo for solar cell applications, it can be acceptable if the reference layer characteristics deviate from the specifications for a limited period of time. Furthermore, if there is more than one layer deposited prior to the compound film deposition process, the deposition processes for all these layers can be controlled simultaneously using the same measurement device by feeding back the measurement data to the respective deposition source controllers. Long-term drift of detector and/or source can be corrected in this case of negligible distance variations by occasionally measuring the composition and thickness of a suitable, stable, inert piece of material or coating located at an accessible place where it neither can move nor be coated with, for example, the coating materials, such as Se.

The invention claimed is:

1. An apparatus for forming a compound film layer that comprises a CIGS material, comprising:
   a deposition chamber comprising a deposition zone;
   a flexible substrate having a deposition surface and a non-deposition surface, wherein the flexible substrate comprises a metal-containing layer that has a surface that forms at least part of the deposition surface;
   a substrate transport device that is configured to transfer the flexible substrate in a first direction through the deposition zone of the deposition chamber when forming the compound film layer;
   a deposition source block disposed in the deposition zone, comprising:
      a first deposition source that is configured to deliver a flux of a first material to the deposition surface of the flexible substrate as the flexible substrate is transferred through the deposition zone, wherein a heated region of the first deposition source contains the first material which consists essentially of gallium (Ga); and
      a second deposition source that is configured to deliver a flux of a second material to the deposition surface of the flexible substrate as the flexible substrate is transferred through the deposition zone, wherein the first and second deposition sources are disposed a distance apart along the first direction, and a heated region of the second deposition source contains the second material which consists essentially of indium (In);
   a measurement device having an x-ray detector and either an x-ray source or an electron source that are positioned over the non-deposition surface of the flexible substrate and directly over the deposition source block within the deposition zone, wherein the non-deposition surface is opposed to the deposition surface of the flexible substrate, and the flexible substrate is disposed between the measurement device and the deposition source block; and
   a controller that is configured to:
      determine a ratio of the first material to the second material deposited on the deposition surface of the flexible substrate based on information received from the x-ray detector of the measurement device, wherein the x-ray detector is configured to detect K-line fluorescence radiation only or K-line and L-line fluorescence radiation, and the determined ratio is generated by analyzing the detected fluorescent radiation wavelengths, and
      adjust an amount of the first material provided by the first deposition source or an amount of the second material provided by the second deposition source to the deposition surface-based on the determined ratio.

2. The apparatus of claim 1, wherein
   the first deposition source further comprises a heating element that is configured to heat an amount of the first material disposed within the first deposition source, and
   the second deposition source further comprises a heating element that is configured to heat an amount of the second material disposed within the second deposition source.

3. The apparatus of claim 2,
   wherein the heating elements in the first and the second deposition sources each further comprise a plurality of deposition source units that are disposed along a second direction that is perpendicular to the first direction, wherein each of the deposition source units in the first deposition source are configured to evaporate a portion of the first material disposed in the heated region and each of the deposition source units in the second deposition source are configured to evaporate a portion of the second material disposed in the heated region.

4. The apparatus of claim 1, wherein
   the deposition source block further comprises:
      a third deposition source that is configured to deliver a flux of a third material to the deposition surface of the flexible substrate, and having an amount of a third material disposed within a heated region of the third deposition source, wherein the third material consists essentially of copper (Cu); and
      a fourth deposition source that is configured to deliver a flux of the first material to the deposition surface of the flexible substrate, wherein a heated region of the fourth deposition source contains the first material which consists essentially of gallium (Ga),
   wherein the first, second, third and fourth deposition sources are sequentially disposed along the first direction.

5. The apparatus of claim 1, wherein the measurement device further comprises:
   the x-ray source; and
   a housing in which the x-ray detector and the x-ray source are disposed.

6. The apparatus of claim 1, wherein the measurement device further comprises the x-ray source and a housing in which the x-ray detector and the x-ray source are disposed, wherein the housing is in contact with the non-deposition surface of the flexible substrate.

7. The apparatus of claim 1, wherein the measurement device further comprises a housing in which the x-ray detector and either the x-ray source or the electron source are disposed, and the apparatus further comprises a cooling device configured to cool the measurement device.

8. The apparatus of claim 1, wherein the flexible substrate further comprises a polymer material, the measurement device further comprises the x-ray source and a housing in which the x-ray detector and the x-ray source are disposed, and the housing is in contact with the non-deposition surface of the flexible substrate.

9. The apparatus of claim 1, further comprising a cooling device configured to cool the measurement device.

10. The apparatus of claim 1, wherein the controller is further configured to adjust the amount of the first material provided by the first deposition source or the amount of the second material provided by the second deposition source based on a comparison of the determined ratio and a stored compositional profile that is accessible to the controller.

11. The apparatus of claim 10, wherein the determined ratio is generated from fluorescent radiation detected by the x-ray detector, wherein the detected florescent radiation has a wavelength of the K-line fluorescent radiation.

12. An apparatus for forming a compound film layer that comprises a CIGS material, comprising:
a deposition chamber comprising a deposition zone;
a first deposition source block disposed in the deposition zone of the deposition chamber, the first deposition source block comprising:
  a first deposition source comprising a heating element and a heated region that contains an amount of a first material, wherein the heating element is positioned to heat an amount of the first material disposed within the heated region of the first deposition source and the first material consists essentially of gallium (Ga);
  a second deposition source comprising a heating element and a heated region that contains an amount of a second material; wherein the heating element is positioned to heat an amount of the second material disposed within the heated region of the second deposition source, and the second material consists essentially of indium (In); and
  a third deposition source comprising a heating element and a heated region that contains an amount of the first material; wherein the heating element is positioned to heat an amount of the first material disposed within the heated region of the third deposition source, and the first, second and third deposition sources are serially disposed a distance apart along a first direction;
a flexible substrate that extends from an input roll to an output roll and through the deposition zone of the deposition chamber, wherein the flexible substrate comprises a flexible body and a metal-containing layer, and a surface of the metal-containing layer forms at least part of a deposition surface of the flexible substrate;
a substrate transport device that is configured to transfer the flexible substrate, relative to the first deposition source block, in the first direction from the input roll to the output roll, wherein the first, second and third deposition sources are positioned to deliver a flux of either of the first or the second material to the surface of the metal-containing layer disposed over the flexible substrate during processing;
a measurement device that is fixedly positioned within the deposition zone of the deposition chamber and having an x-ray detector and an x-ray source that are positioned over a non-deposition surface of the flexible substrate and directly over the first deposition source block, wherein the non-deposition surface is opposed to the deposition surface of the flexible substrate, and the flexible substrate is disposed between the measurement device and the first deposition source block; and
a controller that is configured to:
  determine a ratio of the first material to the second material deposited on the deposition surface of the flexible substrate based on information received from the x-ray detector of the measurement device, wherein the x-ray detector is configured to detect K-line fluorescence radiation only or K-line and L-line fluorescence radiation, and the determined ratio is generated by analyzing the detected fluorescent radiation wavelengths, and
  adjust an amount of energy generated by the heating element in the first, second or third deposition sources based on the determined ratio.

13. The apparatus of claim 12, wherein the heating elements in the first, second and third deposition sources each further comprise a plurality of deposition source units that are disposed along a second direction that is perpendicular to the first direction, wherein
the first deposition source block further comprises:
  a fourth deposition source that is configured to deliver a flux of a third material to the metal-containing layer disposed over the deposition surface of the flexible substrate, and containing an amount of a third material that comprises copper (Cu) disposed within a heated region of the fourth deposition source, wherein the fourth deposition source is disposed between the second and third deposition sources along the first direction, and
wherein the first, second, fourth and third deposition sources are sequentially disposed along the first direction.

14. The apparatus of claim 12, wherein the measurement device further comprises a housing in which the x-ray detector and the x-ray source are disposed.

15. The apparatus of claim 12, wherein the measurement device further comprises a housing in which the x-ray detector is disposed, wherein the housing is in direct contact with the non-deposition surface of the flexible substrate.

16. The apparatus of claim 12, wherein
the measurement device further comprises:
  a housing in which the x-ray detector and the x-ray source are disposed, wherein the housing is in contact with the non-deposition surface of the flexible substrate, and
the apparatus further comprises a cooling device configured to cool the measurement device.

17. The apparatus of claim 12, wherein the measurement device further comprises a housing in which the x-ray detector and x-ray source are disposed, and the housing is fixedly disposed over a portion of a second region of the flexible substrate, wherein the second region is opposite to a first region of the flexible substrate which receives the flux of the first material from the first deposition source, the flux of the second material from the second deposition source and the flux of the first material from the third deposition source.

18. The apparatus of claim 12, further comprising a second deposition source block that is disposed in the deposition chamber, and a distance in the first direction from the first deposition source block, and the second deposition source block comprises:

a fourth deposition source configured to deliver a flux of the first material to the deposition surface of the flexible substrate during the formation of the compound film layer; and a fifth deposition source configured to deliver a flux of the second material to the deposition surface of the flexible substrate during the formation of the compound film layer, wherein the apparatus further comprises:

an additional measurement device that is fixedly positioned over a non-deposition surface of the flexible substrate and over a gap formed between the first deposition source block and the second deposition source block, and the additional measurement device comprises an x-ray detector and an x-ray source, and the controller is further configured to adjust an amount of energy generated by the heating element in the first, second or third deposition sources based on information received from the additional measurement device.

19. The apparatus of claim 18, wherein the measurement device further comprises a first housing in which the x-ray detector and the x-ray source of the measurement device are disposed, the additional measurement device further comprises a second housing in which the x-ray detector and the x-ray source of the additional measurement device are disposed, and the first housing and the second housing are both in contact with the non-deposition surface of the flexible substrate.

20. The apparatus of claim 12, further comprising a cooling device configured to cool the measurement device.

21. The apparatus of claim 12, wherein the controller is further configured to adjust the amount of energy generated by the heating element in the first, second or third deposition sources based on a comparison of the determined ratio and a stored compositional profile that is accessible to the controller.

22. The apparatus of claim 21, wherein the determined ratio is generated from fluorescent radiation detected by the x-ray detector, wherein the detected florescent radiation has a wavelength of the K-line fluorescent radiation.

* * * * *